(12) United States Patent
Yan et al.

(10) Patent No.: US 10,243,063 B2
(45) Date of Patent: Mar. 26, 2019

(54) METHOD OF UNIFORM CHANNEL FORMATION

(71) Applicant: Applied Materials, Inc., Santa Clara, CA (US)

(72) Inventors: Chun Yan, San Jose, CA (US); Xinyu Bao, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/617,613

(22) Filed: Jun. 8, 2017

(65) Prior Publication Data
US 2018/0033873 A1 Feb. 1, 2018

Related U.S. Application Data

(60) Provisional application No. 62/368,865, filed on Jul. 29, 2016.

(51) Int. Cl.
*H01L 29/66* (2006.01)
*H01L 21/02* (2006.01)
*H01L 29/78* (2006.01)
*H01L 29/04* (2006.01)

(52) U.S. Cl.
CPC .... *H01L 29/66795* (2013.01); *H01L 21/0245* (2013.01); *H01L 21/02461* (2013.01); *H01L 21/02463* (2013.01); *H01L 21/02502* (2013.01); *H01L 21/02516* (2013.01); *H01L 21/02543* (2013.01); *H01L 21/02546* (2013.01); *H01L 21/02639* (2013.01); *H01L 29/045* (2013.01); *H01L 29/66522* (2013.01); *H01L 29/7853* (2013.01)

(58) Field of Classification Search
None
See application file for complete search history.

(56) References Cited

U.S. PATENT DOCUMENTS

| 8,173,551 | B2 | 5/2012 | Bai et al. |
| 2014/0342533 | A1 | 11/2014 | Huang |
| 2015/0380258 | A1 | 12/2015 | Liu et al. |
| 2016/0233206 | A1 | 8/2016 | Morrow et al. |

FOREIGN PATENT DOCUMENTS

WO 2016105437 A1 6/2016

*Primary Examiner* — Long Pham
(74) *Attorney, Agent, or Firm* — Patterson + Sheridan LLP

(57) ABSTRACT

Embodiments described herein generally provide a method and apparatus to form semiconductor devices. Specifically, embodiments describe an apparatus and methods of forming channels in sub-5 nm node FinFETS. The method provides for various processing steps to deposit a dielectric layer over a substrate. The method continues by etching a trench in the dielectric layer, depositing a silicon layer within the trench, depositing a buffer layer on top of the silicon layer in the trench, removing a portion of the buffer layer to form a planar surface, etching the buffer layer into a v-shape, and depositing a channel layer on top of the v-shaped buffer layer. The v-shaped buffer layer advantageously negates facet formation and provides for an InGaAs fin-channel with uniform distribution of indium and gallium throughout the channel.

15 Claims, 5 Drawing Sheets

METHOD OF UNIFORM CHANNEL FORMATION

CROSS-REFERENCE TO RELATED APPLICATIONS

This application claims benefit of U.S. provisional patent application Ser. No. 62/368,865, filed Jul. 29, 2016, which is herein incorporated by reference.

BACKGROUND

Field

Embodiments described herein generally relate to methods for forming semiconductor devices, and more particularly to methods for forming transistors.

Description of the Related Art

In response to an increased need for smaller electronic devices with denser circuits, devices with three dimensional structures have been developed. An example of such devices may include FinFETs. FinFET devices typically include Group III-V element semiconductor fins with high aspect ratios in which the channel and source/drain regions for the transistor are formed thereover. A gate electrode is then formed over and alongside of a portion of the fin devices utilizing the advantage of the increased surface area of the channel and source/drain regions to produce faster, more reliable and better-controlled semiconductor transistor devices. Further advantages of FinFETs include reducing the short channel effect and providing higher current flow.

However, fabrication of a high aspect ratio FinFET is difficult at the small dimensions typical of modern devices. Additionally, there are major challenges of growing III-V material on silicon, such as lattice mismatch, valence difference, thermal property differences, conductivity differences, and anti-phase defects. Metamorphic buffers are commonly used to reduce lattice mismatch and anti-phase defects. Buffer layer materials are typically selected to provide a transition in properties such as lattice structure and/or valence between a substrate material and a channel material. Growth of an appropriate butter in narrow trenches can be effective to reduce anti-phase defects, which becomes increasingly important as channel dimensions decrease. In some architectures, the channel (such as indium gallium arsenide (InGaAs)) stacks on top of the buffer layer (materials with lattice grading such as gallium arsenide (GaAs), indium phosphide (InP), etc.). However, it is difficult to obtain uniform channel thickness due to trench depth and critical dimension (CD) variation, and growth uniformity drift across the wafer, especially as device sizes are becoming smaller and smaller. This lack of uniformity results in decreased device yield.

Therefore, there is a need for an improved method and apparatus to form precise channel layers in semiconductor devices.

SUMMARY

Embodiments described herein generally provide a method and apparatus to form semiconductor devices. Specifically, embodiments describe an apparatus and methods of forming channels in sub-5 nm node FinFETS. In one embodiment, a method includes depositing a dielectric material on a substrate, etching the dielectric material to form a trench, depositing a silicon material into the trench, overfilling the trench with a buffer material, planarizing the buffer material to remove the overfill, etching the buffer material into a v-shape, and depositing a channel material in the v-shaped trench.

In another embodiment, a method includes depositing a dielectric material on a substrate, etching the dielectric material to form a trench, depositing a silicon material into the trench, etching the silicon material in the trench into a v-shape, depositing a buffer material on top of the v-shaped silicon material in the trench, removing a portion of the buffer material to form a planar surface, etching the buffer material into a v-shape, and depositing a channel material on top of the v-shaped buffer material.

In another embodiment, a semiconductor device is disclosed. The semiconductor device includes a dielectric layer disposed on a substrate, a trench disposed in the dielectric material, a silicon layer disposed in the trench, and a buffer layer disposed on top of the silicon layer in the trench. The buffer layer has a v-shaped surface. The semiconductor device also includes an InGaAs channel. The InGaAs channel has a v-shaped surface that is in contact with the v-shaped surface of the buffer layer.

BRIEF DESCRIPTION OF THE DRAWINGS

So that the manner in which the above recited features of the disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein generally provide a method and apparatus to form semiconductor devices. Specifically, embodiments describe an apparatus and methods of forming channels in sub-5 nm node FinFETS. The method provides for various processing steps to deposit a dielectric material over a substrate. The method continues by etching a trench in the dielectric material, depositing a silicon material within the trench, depositing a buffer material on top of the silicon material in the trench, removing a portion of the buffer material to form a planar surface, etching the buffer material into a v-shape, and depositing a channel material on top of the v-shaped buffer material. The v-shaped buffer material advantageously negates facet formation and provides for an InGaAs fin-channel with uniform distribution of indium and gallium throughout the channel.

Figure 1:
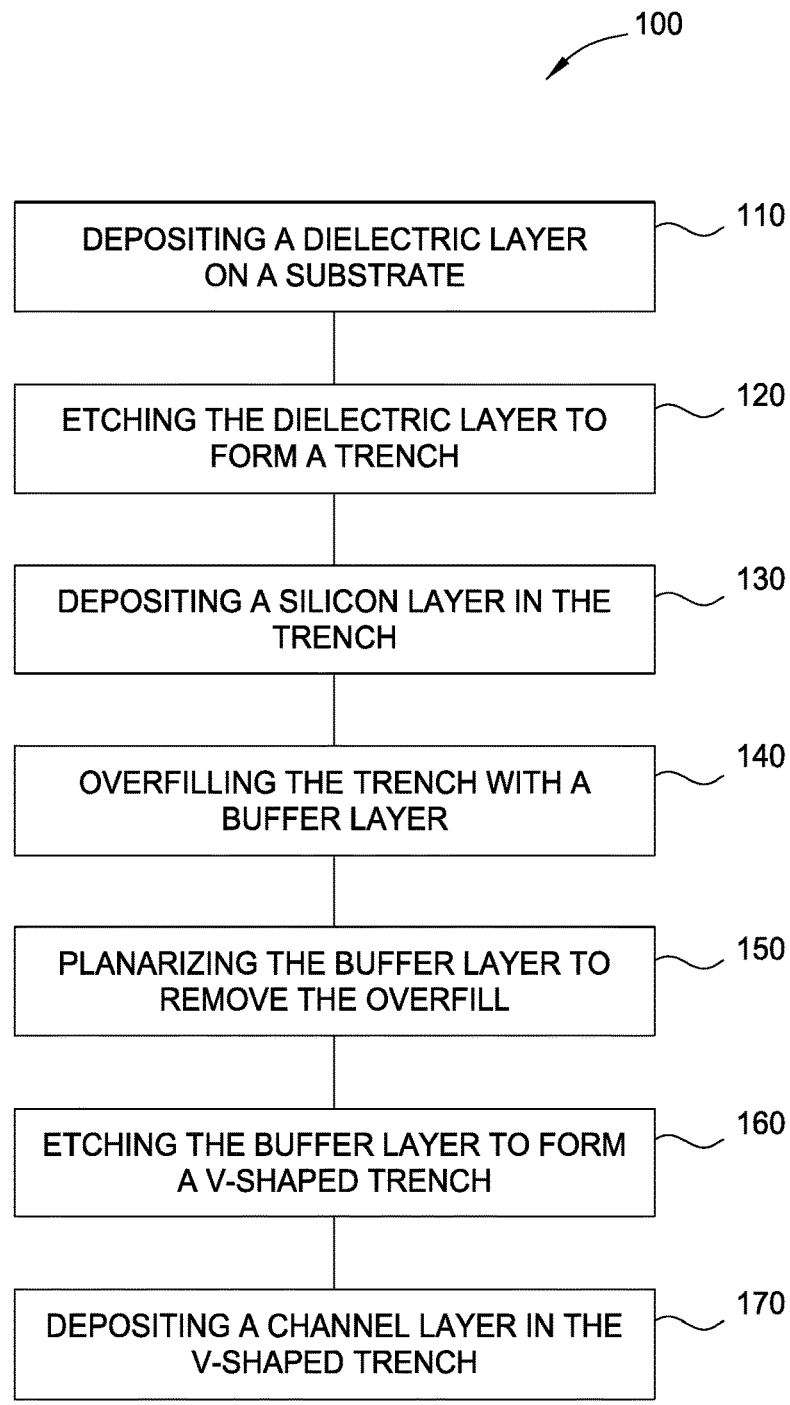
FIG. 1 shows a flow diagram summarizing a method according to one embodiment described herein.

FIG. 1 shows a flow diagram summarizing a method 100 for forming uniform channels comprising Group III-V elements on a silicon substrate. FIGS. 2A-2H depict stages of fabrication of a device 200 in accordance with the method 100 of FIG. 1. The method 100 is described below in accordance with stages of formation of precise channels comprising Group III-V elements on a substrate as illustrated in FIGS. 2A-2H.

Figure 2A:
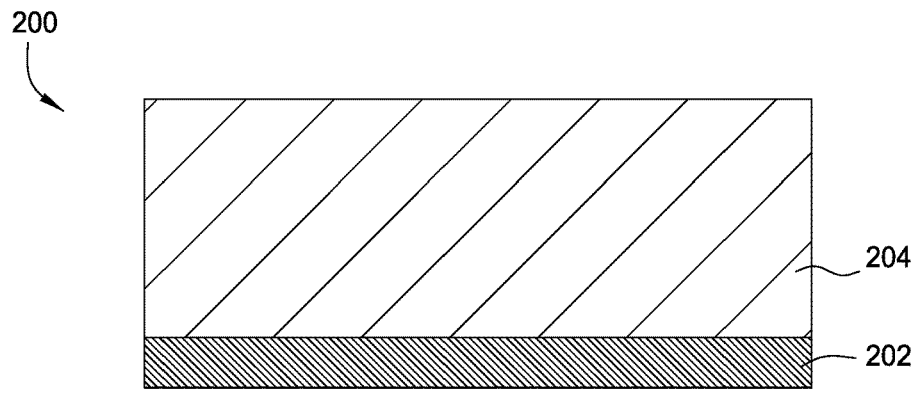
FIGS. 2A-2H show stages of fabrication of a device structure in accordance with the method of FIG. 1.

The method 100 starts at operation 110 where a dielectric layer 204 is deposited on a substrate 202, as shown in FIG. 2A. The substrate 202 may be a silicon-containing substrate. The substrate may further comprise germanium (Ge), carbon (C), boron (B), phosphorous (P), or other known elements that may be co-grown, doped and/or associated with silicon materials. The substrate 202 may be part of a device, such as a CMOS device. The CMOS device may be sub-5 nm. In one embodiment, the CMOS device may be 3 nm. Other devices, such as fin shaped field effect transistors (FinFETs) or the like may be used with the inventive methods provided herein.

The dielectric material 204, such as a shallow trench isolation (STI) oxide, may comprise one or more of silicon oxide (SiO), silicon dioxide ($SiO_2$), silicon nitride (SiN), silicon oxynitride (SiON), aluminum oxide, or other suitable materials that may be used to form a dielectric material. The dielectric material 204 may be deposited by various deposition processes. For example, the dielectric material 204 may be deposited by a chemical vapor deposition (CVD) process, which may be plasma enhanced.

Figure 2B:
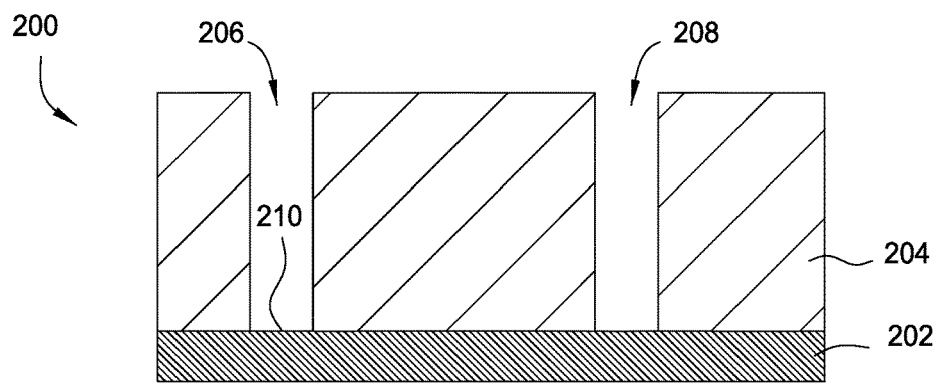

At operation 120, the dielectric material is etched to form a trench. As seen in FIG. 2B, a plurality of trenches 206, 208 may be formed in the dielectric material 204. The trenches 206, 208 have a bottom surface 210, respectfully. In one embodiment, the bottom surface 210 is the exposed substrate 202. In other words, etching the dielectric material 204 may expose a portion of the substrate 202. The exposed portion of the substrate 202 may be the bottom surface 210. The trenches 206, 208 may be formed by patterning the dielectric material 204, using for example an etching process, to achieve the desired trench characteristics. Suitable methods of etching the dielectric material 204 include anisotropic dry etching or an in-situ dry clean process of the substrate 202. Generally, etch processes associated with embodiments provided herein may be performed at temperatures between about 30° C. and about 750° C. After the trenches 206, 208 have been formed in the dielectric material 204, the trenches 206, 208 may be optionally cleaned.

Figure 2C:
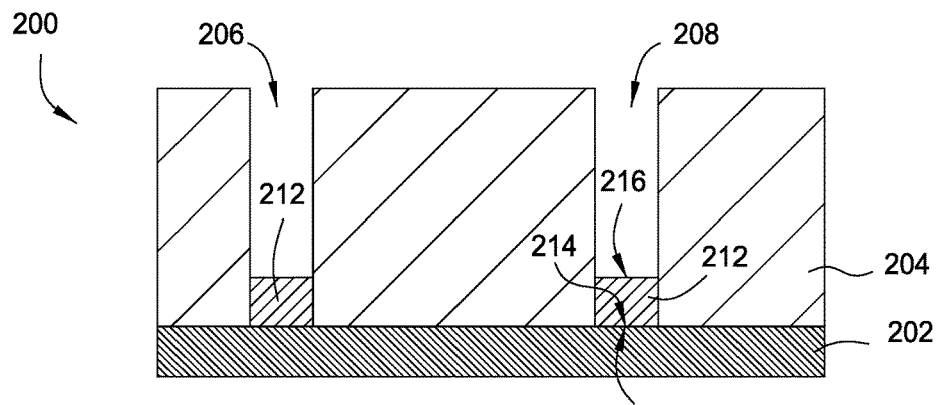

At operation 130, a silicon material 212 is deposited in the trench 206, 208, as shown in FIG. 2C. The silicon material may further comprise germanium (Ge), carbon (C), boron (B), phosphorous (P), or other known elements that may be co-grown, doped and/or associated with silicon materials. The silicon material 212 has a first surface 214 in contact with the bottom surface 210. The silicon material 212 has a second surface 216 opposite the first surface 214. The silicon material 212 may include surfaces having (100) plane, (111) plane, and (110) plane. In one embodiment, the silicon material 212 is exposed to an etchant or gas mixture. The portion of the feature that is removed by the etchant or the gas mixture can be controlled by tuning the etch selectivity between the surface having the (110) plane and the surface having the (100) plane. The etch selectivity between the surface having the (110) plane and the surface having the (100) plane can be expressed as the etch rate ratio of the surface having the (110) plane to the surface having the (100) plane, and the etch rate ratio can affect the portion of the feature that is removed. For example, if the etch rate ratio is high (i.e., higher etch rate on the surface having the (110) plane than the etch rate on the surface having the (100) plane), the lateral, or width, portion of the feature is removed while the height or thickness portion of the feature is substantially unchanged. The surfaces having the (111) plane have the slowest etch rate compared to the surfaces having the (110) or (110) plane. If the etch rate ratio is low (i.e., lower etch rate on the surface having the (110) plane than the etch rate on the surface having the (100) plane), the height or thickness portion of the feature is removed, while the lateral portion of the feature is substantially unchanged. In one embodiment, the etchant acts on the (100) plane and (110) plane faster than the (111) plane. Thus, the second surface 216 is etched into a V-shape having a (111) plane. In another implementation, the second surface 216 is substantially parallel to the first surface 214. The etch selectivity between the surface having the (110) plane and the surface having the (100) plane, or the etch rate ratio of the surface having the (110) plane to the surface having the (100) plane, can be adjusted by varying the pressure within the processing chamber, the ratio of the flow rate of the etchant or gas mixture to the flow rate of the carrier gas, and/or the ratio of the flow rate of the etch enhancer or suppressor to the flow rate of the etchant.

Figure 2D:
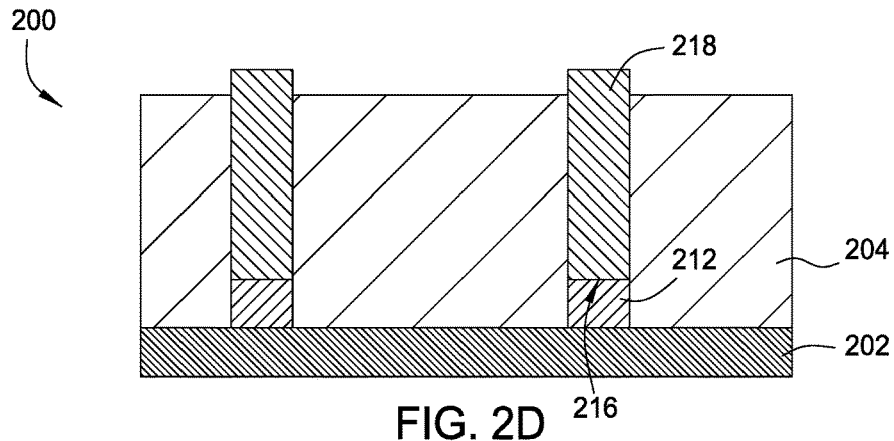

At operation 140, a buffer material 218 overfills the trench, as seen in FIG. 2D. The buffer material 218 may be deposited by any suitable deposition method, such as chemical vapor deposition (CVD), epitaxial deposition, or any other suitable deposition method. The one or more Group III and/or Group V source materials may be in any suitable state, such as a solid or liquid that may be sublimed or vaporized, respectively, or in a gaseous state. The source materials may be metal organic precursors or the like. The buffer material 218 may be deposited to a thickness of between about 100 nm to about 200 nm. In one embodiment, the buffer material 218 is deposited on the v-shaped second surface 216 of the silicon material 212. In such an embodiment, deposition of the buffer material 218 results in the crystal defects of the device being terminated within the bottom of the V such that as the buffer material 218 is propagated upwards, there are no defects towards a targeted channel region. In other words, any defects of the buffer material 218 are localized adjacent the v-shaped second surface 216. In another embodiment, the buffer material 218 is deposited on the substantially planar second surface 216 of the silicon material 212.

Figure 2E:
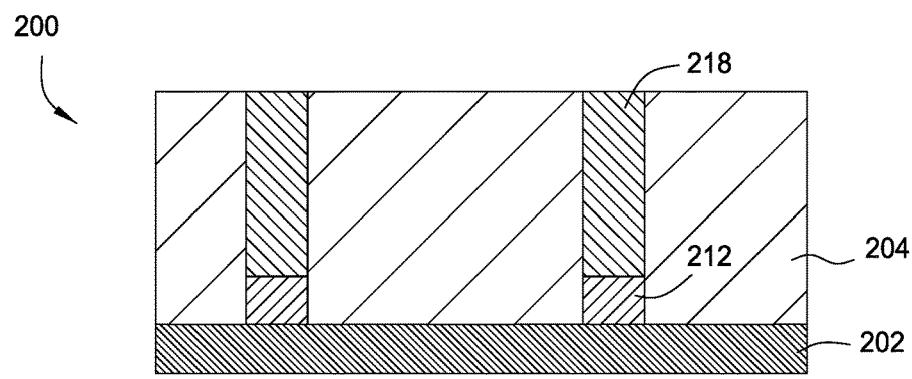

At operation 150, the buffer material 218 is planarized to remove the overfill, as shown in FIG. 2E. In one embodiment, the top of the buffer material 218 is flush with the top of the dielectric material 204. Planarization may occur through a chemical-mechanical polishing (CMP) process.

Figure 2F:
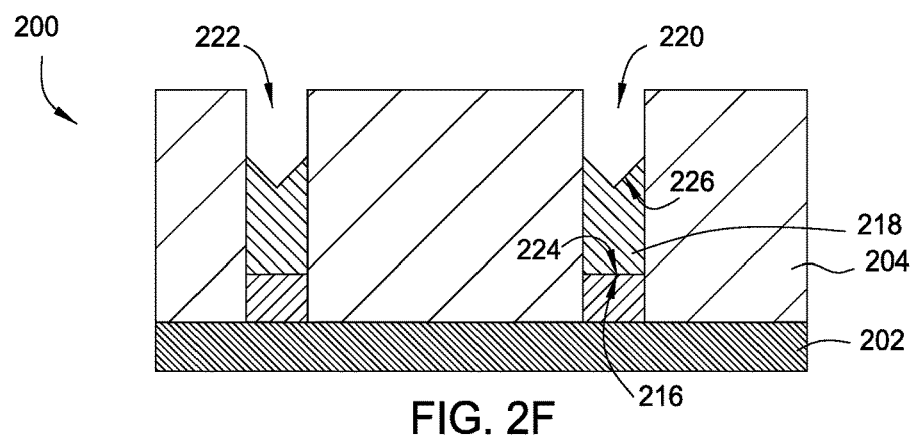

At operation 160, the buffer material 218 is etched to form a v-shaped trench 220, 222, as shown in FIG. 2F. In other words, the trench 220, 222 has a V-shaped bottom. The buffer material 218 may be a type III-V semiconductor material. The buffer material 218 may be selected from the group consisting of gallium arsenide (GaAs) and indium phosphide (InP) or a combination thereof. The buffer material 218 has a first surface 224 adjacent and in contact with second surface 216 of the silicon material 212. The buffer material 218 has a second surface 226 opposite the first surface 224. The second surface 226 of the buffer material 218 has a V-shape. The buffer material 218 has a (100) plane, (110) plane, and a (111) plane. In one embodiment, the etchant acts on the (100) plane and (110) plane faster than the (111) plane. Thus, the second surface 226 of the buffer material 218 is etched into a V-shape having a (111) plane. Suitable methods of etching the buffer material 218 include any suitable etching process, such as anisotropic dry etching or wet etching. In one embodiment, argon (Ar), hydrogen (H), and/or chlorine (Cl) may be used as precursors for etching the buffer material 218. The precursor(s) functions to volatilize the buffer material 218 such that a portion may be removed. In another embodiment, other suitable etching processes may be used to recess the buffer material 218. The buffer material 218 should be recessed to a distance below the top surface of the dielectric material 204 that is about equal to the targeted channel thickness. In one embodiment, the buffer material 218 is recessed below the top surface of the dielectric material 204 at a distance of between about 15 nm to about 60 nm.

Figure 2G:
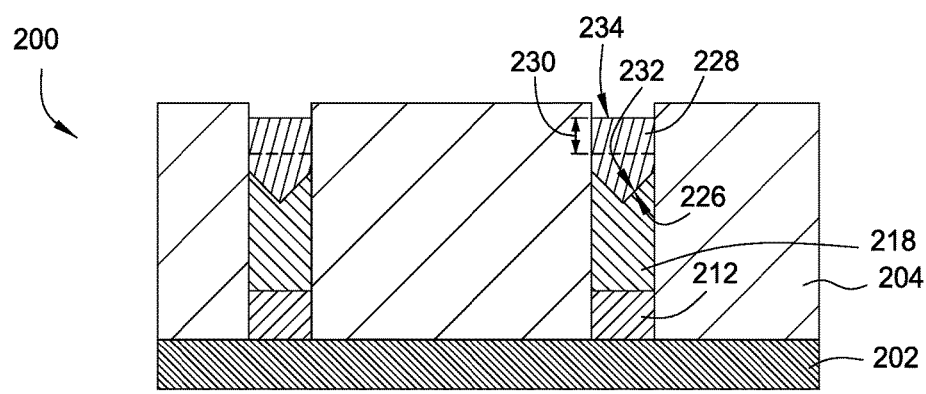

At operation 170, a channel material 228 is deposited in the v-shaped trench 220, 222, as seen in FIG. 2G. The channel material 228 has a first surface 232 mating with the second surface 226 of the buffer material 218. The channel material 228 may comprise any combination of at least a Group III element and a Group V element. In one embodiment, the channel material 228 comprises indium gallium arsenide (InGaAs). In another embodiment, the channel material 228 is selected from the group consisting of aluminum gallium arsenide (AlGaAs), indium gallium antimonide (InGaSb), indium arsenide (InAs), gallium antimonide (GaSb), indium phosphide (InP), indium aluminum arsenide (InAlAs), or indium antimonide (InSb). In further embodiments, the channel material 228 may comprise a Group III-Group V material having high electron mobility and a good crystallographic structure. The channel material 228 may be doped.

The channel material 228 may be deposited by any suitable deposition method, such as chemical vapor deposition (CVD), epitaxial deposition, or any other suitable deposition method. The channel material 228 may be deposited to a target thickness. In one embodiment, the channel material 228 has a thickness of between about 10 nm and about 60 nm. The channel material 228 has a V-shaped first surface 232 mating with the second surface 226 of the buffer material 218. The channel material 228 has a second surface 234 opposite the first surface 232. During deposition, the V-shaped second surface 226 of the buffer material 218 provides a (111) plane. This (111) plane counteracts the facet growth of the channel material 228 such that any defect in the channel material 228 is deposited below the dashed line in FIG. 2G. As the channel material 228 continues to grow, a portion 230 of the channel material 228 grows without any defects. In other words, in one embodiment, the portion 230 of the channel material 228 has a uniform ratio of indium and gallium from the center of the channel material 228 to the edges of the channel material 228. In one embodiment, the thickness of the uniform portion 230 of the channel material 228 is between 10 nm to about 60 nm. In one embodiment, the channel material 228 overfills the v-shaped trench 220, 222. In such an embodiment, the channel material 228 may optionally be planarized using CMP. In another embodiment, deposition of the channel material 228 stops such that the second surface 234 of the channel material 228 is below the top of the dielectric material 204. The dielectric material 204 may optionally be planarized through a CMP process.

Figure 2H:
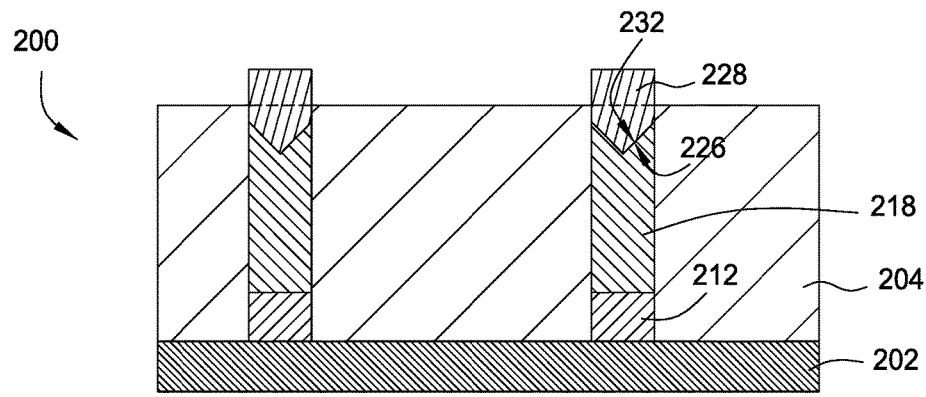

As shown in FIG. 2H, the dielectric material 204 may be etched to expose the channel material 228. Suitable methods of etching the dielectric material 204 include anisotropic dry etching or SiConi™ etching. In one embodiment, the dielectric material 204 may be etched by exposing the dielectric material 204 to an ammonia ($NH_3$) or nitrogen trifluoride ($NF_3$) remote plasma at room temperature and subsequently heating the substrate to about 100° C. In additional embodiments, other methods of etching may be used to etch the dielectric material 204. As shown in FIG. 2H, a semiconductor device 200 may include a dielectric layer 204 disposed on a substrate 202, a trench disposed in the dielectric layer 204, a silicon layer 212 disposed in the trench, and a buffer layer 218 disposed on top of the silicon layer 212 in the trench. The buffer layer 218 may have a V-shaped surface 226. The semiconductor device 200 may also include an InGaAs channel 228. The InGaAs channel 228 has a V-shaped surface 232 in contact with the V-shaped surface 226 of the buffer material 218.

Figure 3:
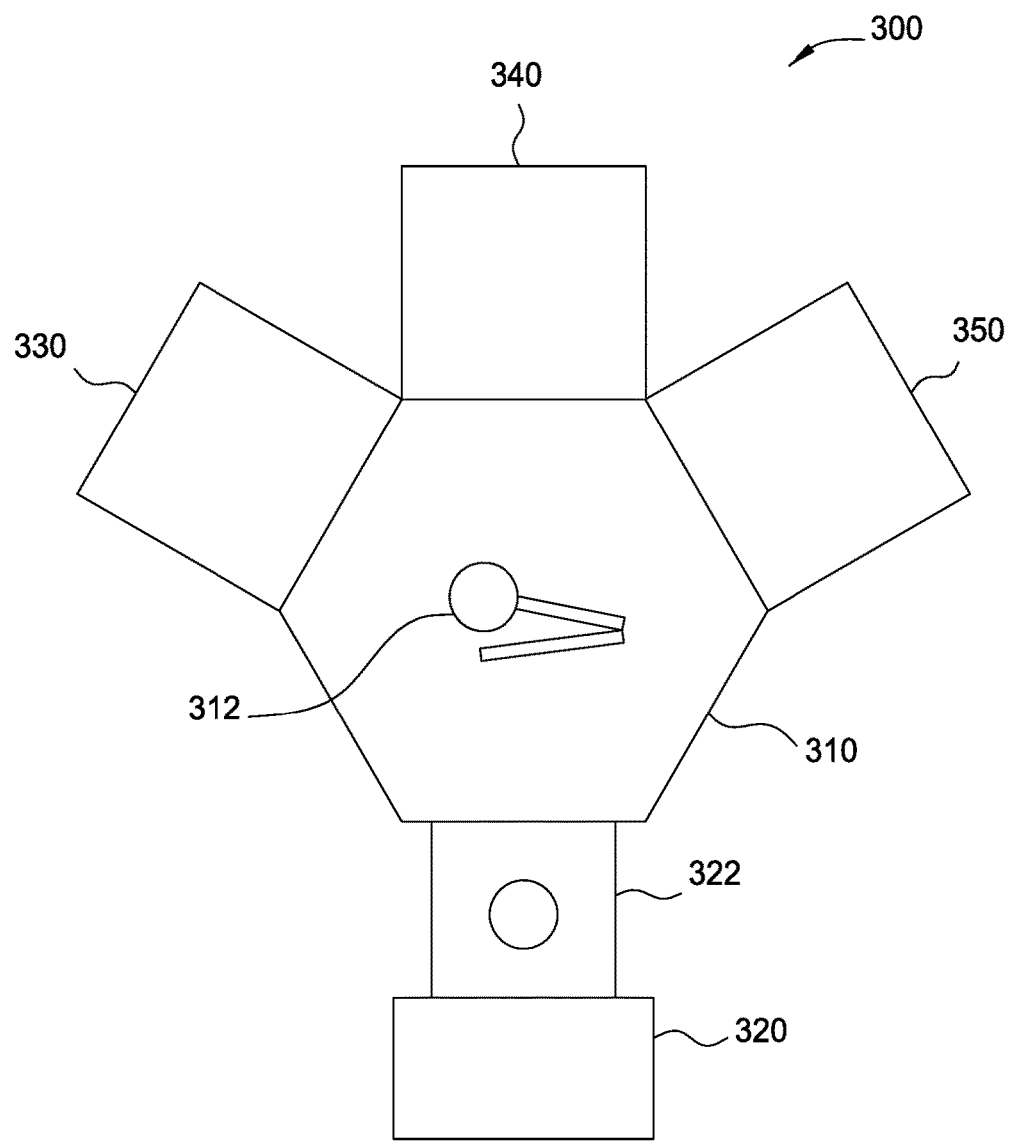
FIG. 3 is a schematic view of an apparatus for performing a method according to one embodiment described herein.

FIG. 3 is a schematic view of an apparatus 300 for performing a method 100 of FIG. 1. More specifically, the apparatus 300 is a cluster tool for fabricating semiconductor devices according to the methods described above. At the center of the apparatus 300 is a transfer chamber 310. Within the transfer chamber 310 is a wafer transferring mechanism 312. The wafer transferring mechanism 312 transfers a wafer from one of the first, second, or third process chambers, 330, 340, and 350, respectively, to the load lock chamber 320 and vice versa. The first, second, and third process chambers, 330, 340, and 350, are connected to the transfer chamber 310. The load lock chamber 320 is connected to the transfer chamber 310 through a wafer alignment chamber 322. In a preferred embodiment, the first process chamber 330 is a deposition chamber, the second process chamber 340 is a CMP chamber, and the third process chamber 350 is an etch chamber. Use of the single apparatus 300 containing process chambers 330, 340, and 350 allows for the various stages of the method of FIG. 1 to occur without breaking vacuum. The vacuum may be broken, however, during the chemical mechanical polishing/planarization processes or wet etching processes.

Thus, methods for forming uniform channels comprising Group III-V elements on a silicon substrate are provided. The method includes depositing the channel layer over a (111) plane. The (111) plane counteracts the facet growth of the channel layer such that any defect in the channel layer is deposited at the bottom of the "V." As the channel layer continues to grow, a portion of the channel layer grows without any defects. As such, the channel layer has a uniform ratio of indium and gallium from the center of the channel layer to the edges of the channel layer thereby increasing overall device yield.

While the foregoing is directed to embodiments of the disclosure, other and further embodiments may be devised without departing from the basic scope thereof, and the scope thereof is determined by the claims that follow.

The invention claimed is:

1. A method of channel formation, comprising:
depositing a dielectric material on a substrate;
etching the dielectric material to form a trench;
depositing a silicon material in the trench;
overfilling the trench with a buffer material;
planarizing the buffer material to remove the overfill;
etching the buffer material to form a v-shaped trench; and
depositing a channel material in the v-shaped trench.

2. The method of claim 1, wherein the etching the dielectric material to form the trench exposes a portion of the substrate and wherein the silicon material is deposited on the exposed portion of the substrate.

3. The method of claim 1, further comprising etching the dielectric material to expose the channel material.

4. The method of claim 1, wherein the buffer material is a type III-V semiconductor material.

5. The method of claim 4, wherein the buffer material is selected from the group consisting of gallium arsenide and indium phosphide.

6. The method of claim 1, wherein the dielectric material is selected from the group consisting of silicon oxide, silicon nitride, and aluminum oxide.

7. The method of claim 1, wherein the channel material is selected from the group consisting of indium phosphide, indium aluminum arsenide, and indium gallium arsenide.

8. The method of claim 1, wherein the channel material has a thickness in a range from about 10 nanometers to about 60 nanometers.

9. A method of channel formation, comprising:
depositing a dielectric material on a substrate;
etching the dielectric material to form a trench;
depositing a silicon material into the trench;
etching the silicon material in the trench into a v-shape;
depositing a buffer material on top of the v-shaped silicon material in the trench;
removing a portion of the buffer material to form a planar surface;
etching the buffer material into a v-shape; and
depositing a channel material on top of the v-shaped buffer material.

10. The method of claim 9 wherein the etching the dielectric material to form the trench exposes a portion of the substrate.

11. The method of claim 9, wherein the buffer material is a type III-V semiconductor.

12. The method of claim 11, wherein the buffer material is selected from the group consisting of gallium arsenide and indium phosphide.

13. The method of claim 9, wherein the dielectric material is selected from the group consisting of type III-V semiconductors, silicon oxide, silicon nitride, and aluminum oxide.

14. The method of claim 9, wherein the channel material is selected from the group consisting of indium phosphide, indium aluminum arsenide, and indium gallium arsenide.

15. The method of claim 9, wherein the channel material has a thickness in a range from about 10 nanometers to about 60 nanometers.

* * * * *